United States Patent
Westphal

[11] Patent Number: 5,998,998
[45] Date of Patent: Dec. 7, 1999

[54] GRADIENT COIL FOR NMR DEVICES

[75] Inventor: Michael Westphal, Offenbach, Germany

[73] Assignee: Bruker Analytik GmbH, Rheinstetten, Germany

[21] Appl. No.: 08/889,959

[22] Filed: Jul. 10, 1997

[30] Foreign Application Priority Data

Jul. 20, 1996 [DE] Germany ............... 196 29 404

[51] Int. Cl.$^6$ .................................. G01V 3/00
[52] U.S. Cl. ............... 324/318; 324/300; 324/306; 324/309; 324/318; 324/319; 324/320; 324/322; 335/216; 335/299; 600/427; 600/412
[58] Field of Search ........................ 324/300, 306, 324/318, 309, 319, 320, 322; 335/216, 299; 600/427, 412

[56] References Cited

U.S. PATENT DOCUMENTS

| | | | |
|---|---|---|---|
| 5,323,135 | 6/1994 | Schmidt | 335/299 |
| 5,334,937 | 8/1994 | Peck et al. | 324/318 |
| 5,406,205 | 4/1995 | Muller | 324/318 |
| 5,545,997 | 8/1996 | Westphal | 324/320 |
| 5,563,567 | 10/1996 | Westphal | 335/299 |
| 5,576,623 | 11/1996 | Muller | 324/318 |
| 5,663,648 | 9/1997 | Chapman | 324/332 |

OTHER PUBLICATIONS

US Patent application S.N. 08/560,874 filed Nov. 20, 1995 "Gradient Coils for Therapy Tomographs".

Primary Examiner—Louis Arana
Assistant Examiner—Brij B. Shrivastav
Attorney, Agent, or Firm—Paul Vincent

[57] ABSTRACT

A gradient coil (1) to generate switched magnetic field gradients in an nuclear spin resonance (NMR) device consisting of one or several current paths (a, b) following windings and being arranged on the surface of a geometric body is characterized in that at least two electrical current paths (a, b) are provided for, running geometrically essentially parallel to each other and being electrically connected in parallel, which current paths cross n times per winding, wherein n is an integer with $n \leq 8$, preferably n=1 or n=2. In this way, eddy current generation by current re-distributions on the gradient coil conductor strips and thereby a time-dependent distortion of the generated magnetic field gradient inside the volume of interest of the NMR apparatus is considerably reduced.

18 Claims, 4 Drawing Sheets

GRADIENT COIL FOR NMR DEVICES

BACKGROUND OF THE INVENTION

The invention concerns a gradient coil to generate switched magnetic field gradients in a nuclear spin resonance (NMR) device consisting of one or more current paths following windings and being arranged on the surface of a geometric body.

Such a gradient coil is for example known from U.S. Pat. No. 5,323,135.

An essential component of NMR systems, being generally employed for tomography, in part, however, also for spectroscopy, is a system of usually three gradient coils each consisting of several partial coils, which gradient coils are independently of each other supplied with currents of different strengths. These gradient coils serve the purpose to superimpose constant magnetic field gradients with adjustable strengths onto the homogeneous magnetic field $B_0$ of the NMR device which is directed along a z axis, whereby the direction of one of these gradients ($dB_z/dz$) is in general parallel to the direction of the homogeneous main field $B_{0z}$ (z gradient=axial gradient) and the directions of the two other gradients ($dB_z/dx$, $dB_z/dy$) are directed orthogonal thereto and to each other and perpendicular to the direction of the main field (x and y gradients=transverse gradients). The spatial region where the magnetic field of these gradient coils varies approximately linearly can be used for volume selective NMR methods (imaging, volume selective spectroscopy) if this region is not further limited by inhomogeneities of the main field.

The gradient coils may for example be realized as x, y and z coils on cylinder surfaces for conventional tomography magnets or as gradient coils for gradient accelerated NMR spectroscopy. Apart from this, planar gradient plates for magnets with pole pieces are also known in NMR tomography. With respect to the geometric design of gradient coils, we refer to the entire contents of commonnly assigned U.S. patent application Ser. No. 08/560,874 and U.S. Pat. No. 5,563,567, where the spatial construction of gradient coils is described in detail.

In the above cited U.S. Pat. No. 5,323,135, a particularly favorable gradient coil system is described, where, for predetermined boundary conditions, on the one hand the inductance L and, apart from this, also further technically relevant parameters of the magnet coil device can be optimized independently of each other, like for example current density distributions, shielding effects, etc.. However, a disadvantage of such a gradient coil device is the effect that for fast gradient switching with such a streamline shaped gradient coil eddy-current-like current distributions on the broad conductor strips are generated distorting the magnetic field of the gradient coil across the volume of interest of the NMR apparatus as a function of time.

It is therefore the purpose of the present invention to improve a gradient coil of the above mentioned kind in such a way that eddy current generation by current redistributions on the conductor strips of the gradient coil and thereby a time-dependent distortion of the magnetic field gradient generated across the volume of interest are considerably reduced.

SUMMARY OF THE INVENTION

According to the invention, this purpose is achieved in a way both surprising and effective, by providing at least two electrical current paths running geometrically essentially parallel to each other and being electrically connected in parallel, which current paths cross n times per winding, wherein n is an integer with n≦8, preferably n=1 or n=2.

By dividing into parallel current paths, under otherwise identical boundary conditions, the number of current paths per area is multiplied, at least doubled. In this way, the width of the individual current strips can be halved or even further reduced. The possibility for eddy current generation on the current strips is drastically reduced in this way, without changing the total inductance L of the gradient coil.

The geometric circuitry linking individual current strips which are running essentially parallel to each other, by means of current crossings ensures that in the current paths connected electrically in parallel there are hardly any current re-distributions caused by differing electric resistances or inductances.

An embodiment of the gradient coil according to the invention is particularly preferred where the current paths exhibit essentially the same Ohmic resistances R and essentially the same inductances L. In this way it is ensured that the partial currents in the individual current paths are rather well identical even in cases of quick gradient switching processes, so that no current re-distributions caused by differing complex resistances of the individual current paths can happen after the switching. In this way, it is possible to generate distortionless magnetic gradient fields across the volume of interest of the NMR apparatus also in the case of fast gradient switching processes.

Also particularly preferred is an embodiment of the invention where the sections of the conductor strips between the crossings are constructed in a streamline shape. Such streamline shaped gradient coils comprise particularly large conductor cross-sections and therefore particularly small Ohmic losses.

In an alternative embodiment of the gradient coil according to the invention, the current paths consist of wires and the gradient coil is preferably a cylindrically wound z gradient coil. Such a gradient coil is particularly simple and cheap to produce, but generally only suitable to generate z gradients.

Also particularly preferred is an embodiment of the invention where a shielding coil is allocated to the gradient coil shielding the magnetic field generated by the gradient coil with respect to conductive structures of the NMR apparatus. Because of the shielding, generation of eddy currents in metallic structures can be minimized, so that the distortions of the magnetic field gradient generated by the gradient coil in the volume of interest are even further reduced.

In principle, the shielding coils, too, can exhibit the inventive construction principle described above. However, an improvement of the above embodiment is particularly easy to produce and therefore cheap, wherein the shielding coil comprises no crossings according to the invention. Since the magnetic field of the gradient coils runs essentially tangentially at the shielding coil surface, the shielding coils neither experience considerable eddy currents nor the resulting field distortions, even for the simple construction.

Further advantages of the invention result from the description and the drawing. The above mentioned features and those to be further described below in accordance with the invention can be utilized individually or collectively in arbitrary combination. The embodiments shown and described are not to be considered as exhaustive enumeration, rather have exemplary character only for the description of the invention.

BRIEF DESCRIPTION OF THE DRAWING

The invention is represented in the drawing and is further explained in connection with embodiments. It is shown in.

DESCRIPTION OF THE PREFERRED EMBODIMENT

Figure 1:
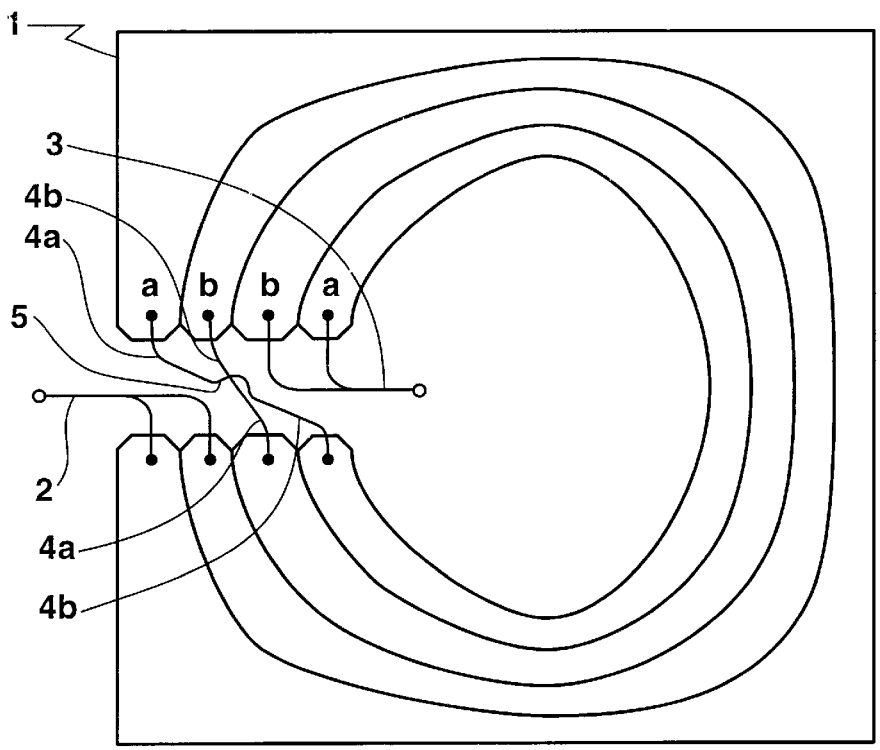
FIG. 1 a schematic representation of a "streamline" gradient coil according to the invention with two parallel current paths and two windings each.

FIG. 1 represents in a schematic way a gradient coil 1 according to the invention with "streamline" construction. The coil comprises two adjacent parallel running current paths a, b with a common current input line 2 and a common current output line 3, i.e. being connected electrically in parallel. After completing one winding, the circuitry of the current paths a, b of the gradient coil 1 is such that the currents of both current paths cross geometrically at a crossing point 5 by means of conducting sections 4a, 4b. Seen radially from outside towards the center, the current path sequence is at first a, b and after the crossing point 5 the sequence is b, a. In this way, the total lengths and therefore the Ohmic resistances R of both current paths a, b are approximately equal. The same is true for the inductance L of both current paths.

Figure 2:
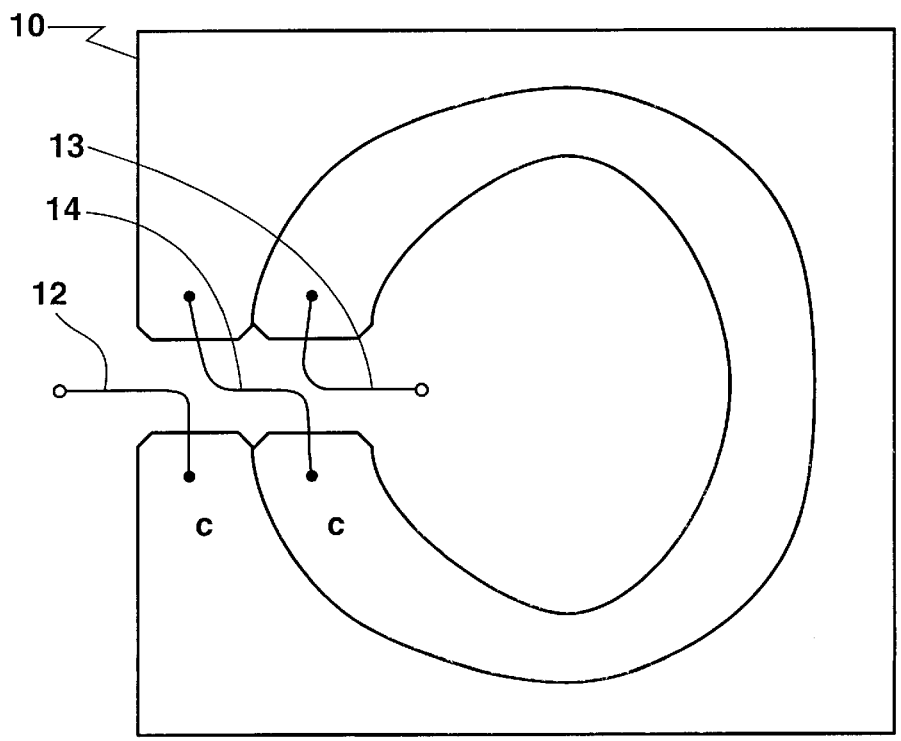
FIG. 2 a schematic representation of a prior art "streamline" gradient coil with a single current path comprising two windings.

In contrast thereto, FIG. 2 shows schematically a prior art "streamline gradient coil 10" comprising only a single current path c with a current input 12, a current output 13 and an inner conducting section 14 electrically connecting the radially outer to the radially inner part of current path c.

In embodiments of the inventive gradient coil which are not represented in the present figure, instead of two, several current paths may run parallel and may electrically be connected in parallel. The crossing positions can thereby effect a geometric "intertwisting" of the current paths in such a way that at the first crossing the at first radially outermost current path is shifted radially furthest to the inside, the, seen from outside, second current path to the radially second position as seen from the inside, and so on. In such a weaving and for an odd number of current paths, the at first central current path would keep its relative position with respect to the "inner winding" current paths and the "outer winding" current paths without crossing of the current.

However, other kinds of circuitry are possible, for example in such a way that for successive crossings the at first radially outermost current path is always shifted by one current path towards the inside, whereas the at first radially innermost current path is radially shifted by one current path towards the outside with respect to its neighboring paths.

Likewise, in embodiments of the inventive gradient coil which are not shown, more than one crossing positions per winding are possible, however, the number of $n \leqq 8$ crossings per winding, i.e. on average each 45°, represents a sensible upper limit for an essentially circular gradient coil. Preferred are embodiments providing one or two crossing positions per winding.

Figure 3A:
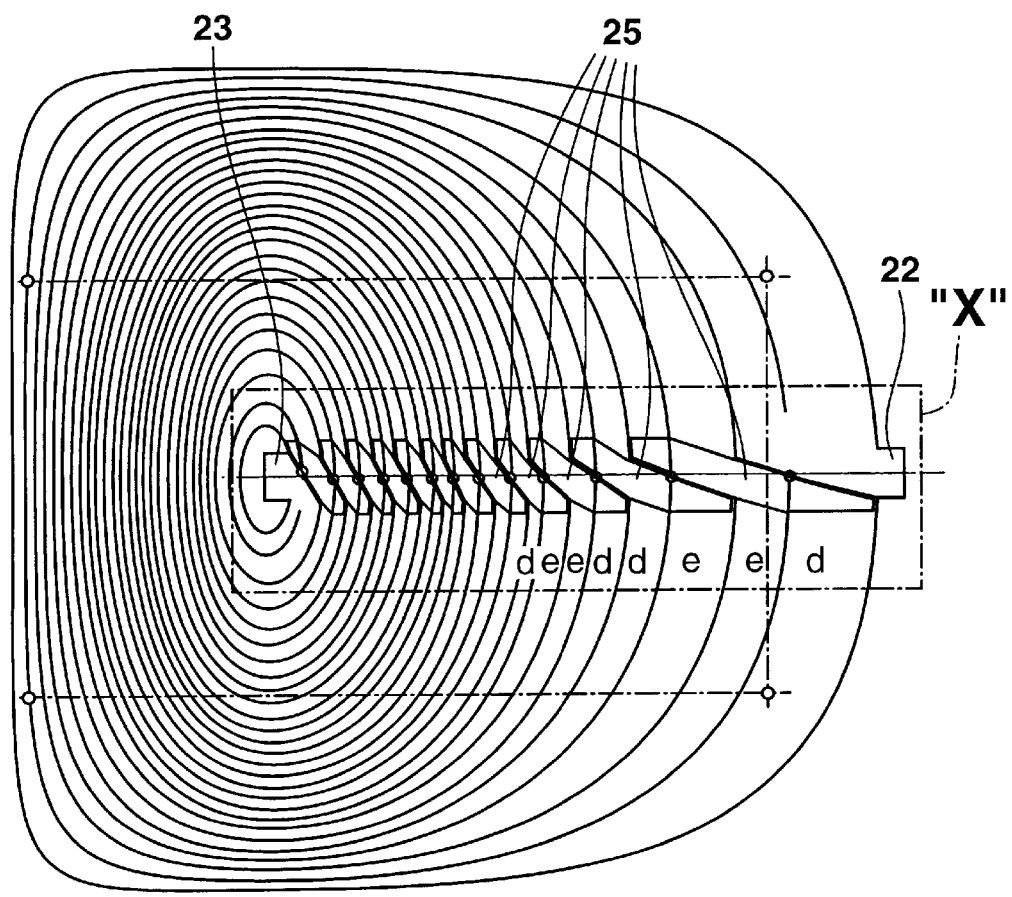
FIG. 3a a quadrant of an x gradient coil with four parts and with "streamline" shape in a planar representation, which in built-in form covers azimuthally about 180° on a cylinder surface.

FIG. 3a shows a top view onto a quadrant of an x gradient coil with four parts unfolded onto a plane which in the built-in state is wound around a cylinder surface. Again, the coil is realized in "streamline" technique and comprises two current paths d and e, running essentially parallel and being supplied in parallel with current via a current input section 22. After passing the coil quadrant, the parallel current exits via a common terminal 23. The current paths each cross each other at crossing positions 25 after describing a full winding (i.e. 360°). In the embodiment shown, altogether twelve crossing positions 25 are provided for.

Figure 3B:
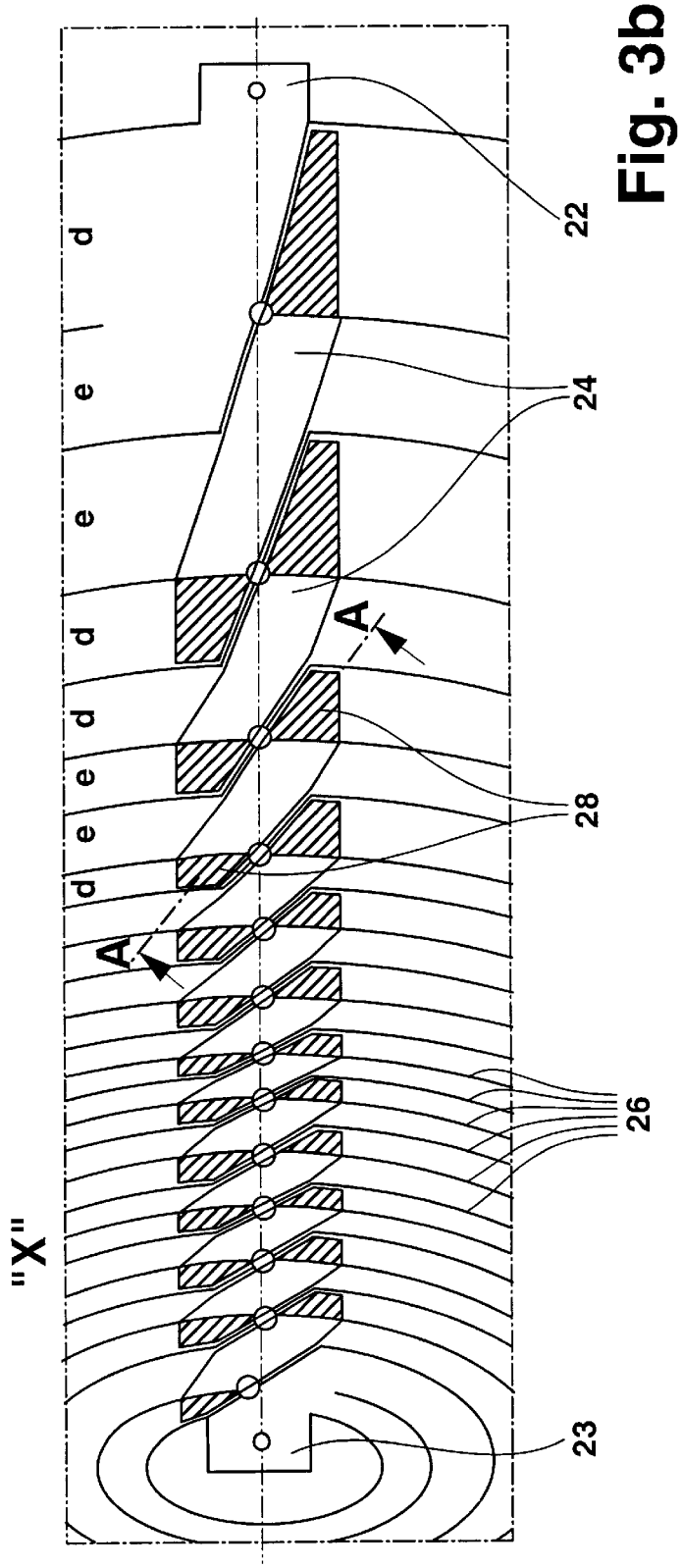
FIG. 3b enlarged view of the central section of the gradient coil of FIG. 3a, marked "x"

The coil quadrant section marked "X" in FIG. 3a is again shown in an enlarged form in FIG. 3b. The areas which are black in FIG. 3a and hatched in FIG. 3b mark solder points 28 of conductor sections 24 each providing at the crossing points a conducting connection of the crossing current path to the parallel current path being crossed.

Figure 3C:
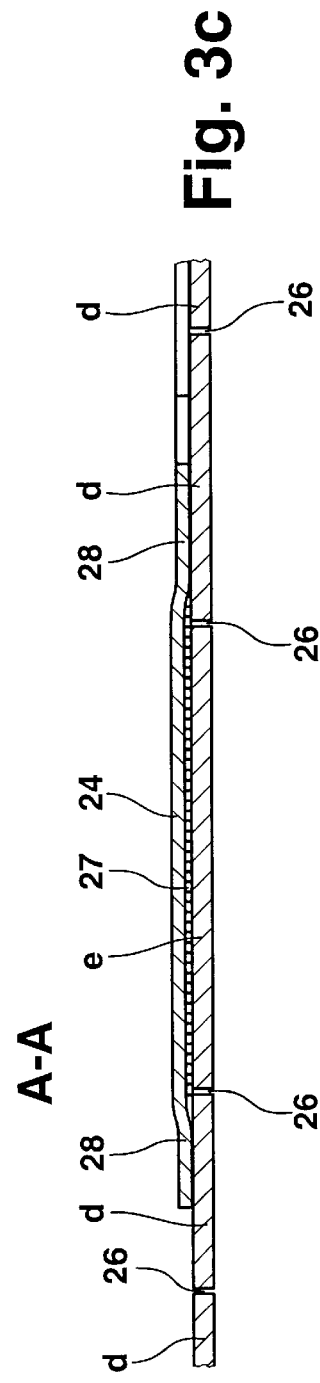
FIG. 3c enlarged cross section in A—A direction across the gradient coil section of FIG. 3b.

FIG. 3c shows a cross-section between points A—A of FIG. 3b in enlarged form. In this way it can be seen that the current paths d, e of the "streamline" coil each are separated from each other by grooves 26 and that, in this case, the conductor section 24 connects two sections of current path d by means of two solder points 28, thereby bridging a section of current path e, which is separated from current section 24 by an insulating layer 27.

Figure 4:
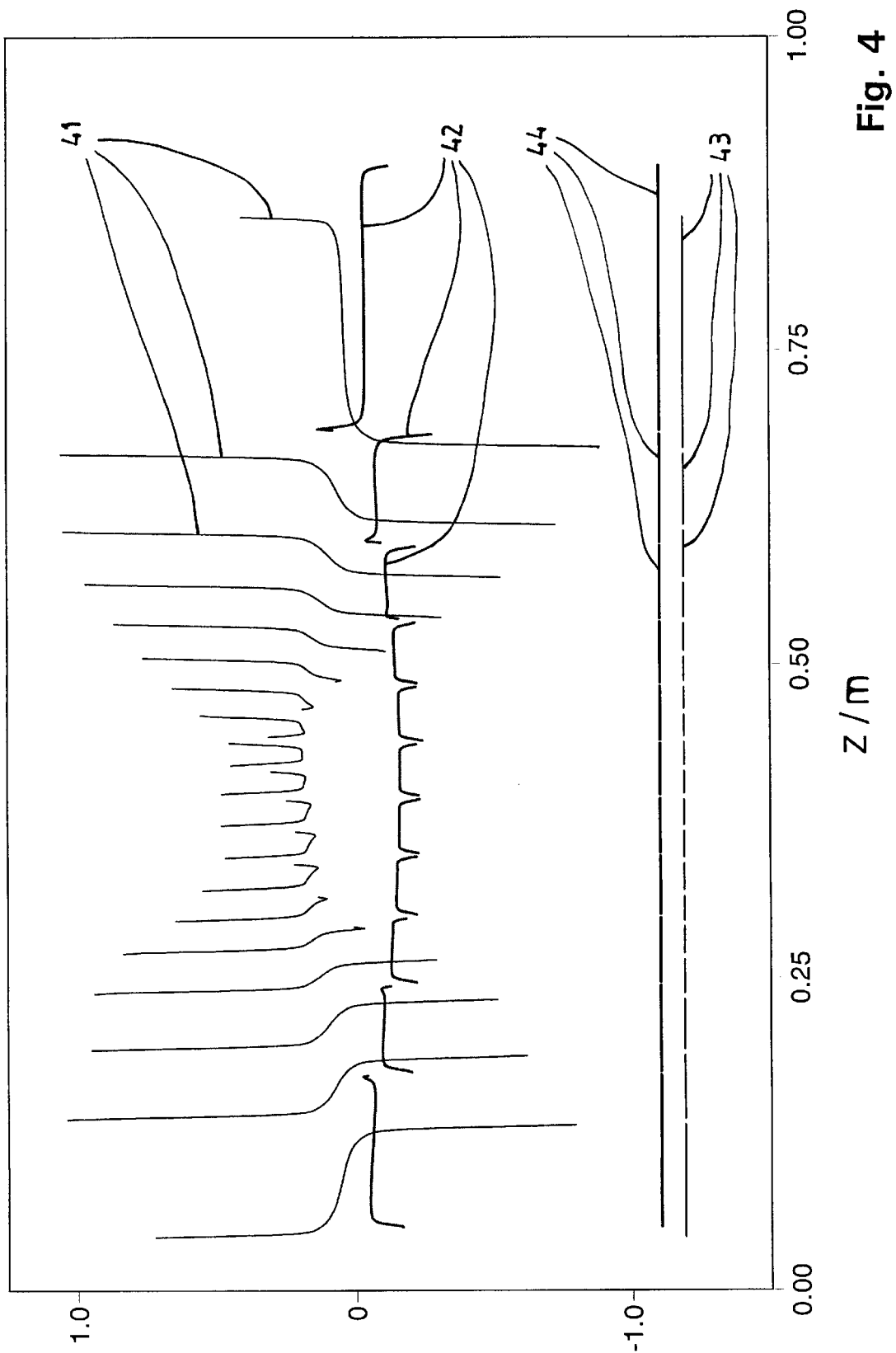
FIG. 4 in the upper part the total current distribution for short-term switching of an inventive gradient coil as well as of a respective shielding coil along the z axis and in the lower part the extension of a current path of the corresponding coil along z direction.

Finally, FIG. 4 represents on a vertical axis the current density distribution 41 in a quadrant of a conventional z gradient coil 43 in "streamline" form as well as the current density distribution of the corresponding shielding coil 44 depending on the z axis position, each one immediately after gradient switching. The current density is in arbitrary units. In the lower part of FIG. 4 the extensions of the conductor strip of the coils in z direction are sketched corresponding to their generated current densities represented in the upper part of the figure.

The current paths of the gradient coils 43 therefore generate the current density distributions 41, whereas the current paths of the shielding coil 44 generate the current density distributions 42. As can immediately be seen, the current density distributions 42 of the shielding coil 44 stay considerably flatter, whereas, at the edges of the respective filament plates, the current density distributions 41 of the gradient coil 43 exhibits very strong amplitudes in positive and negative current direction. During gradient switching, this leads to the above described eddy currents at the current path fringes and thereby to a field distortion of the generated gradient field inside the volume of interest. This problem is largely solved by the above described gradient coil design according to the invention. However, as can be seen in FIG. 4, a modification of the corresponding shielding coils according to the invention is not necessary since these comprise anyway no strong oscillations of the current density distribution at the current path fringes but show a basically nearly flat profile.

I claim:

1. Gradient coil system to generate switched magnetic field gradients in a nuclear spin resonance (NMR) device consisting of current paths following windings and being arranged on the surface of a geometric body, comprising a gradient coil with at least two electrical current paths running geometrically essentially parallel to each other and being electrical connected in parallel, which current paths cross n times per winding, wherein n is an integer with $n \leq 8$.

2. Gradient coil system according to claim 1, characterized in that the current paths essentially comprise the same Ohmic resistances R and essentially the same inductances L.

3. Gradient coil system according to claim 1, characterized in that the current path sections between the crossings are constructed as streamlines.

4. Gradient coil system according to claim 2, characterized in that the current path sections between the crossings are constructed as streamlines.

5. Gradient coil system according to claim 1, characterized in that the current paths consist of wires and that the gradient coil is a cylindrically wound z gradient coil.

6. Gradient coil system according to claim 2, characterized in that the current paths consist of wires and that the gradient coil is a cylindrically wound z gradient coil.

7. Gradient coil system according to claim 1, characterized in that a shielding coil is allocated to the gradient coil shielding the magnetic field generated by the gradient coil with respect to conductive structures of the NMR device.

8. Gradient coil system according to claim 2, characterized in that a shielding coil is allocated to the gradient coil shielding the magnetic field generated by the gradient coil with respect to conductive structures of the NMR device.

9. Gradient coil system according to claim 3, characterized in that a shielding coil is allocated to the gradient coil shielding the magnetic field generated by the gradient coil with respect to conductive structures of the NMR device.

10. Gradient coil system according to claim 4, characterized in that a shielding coil is allocated to the gradient coil shielding the magnetic field generated by the gradient coil with respect to conductive structures of the NMR device.

11. Gradient coil system according to claim 5, characterized in that a shielding coil is allocated to the gradient coil shielding the magnetic field generated by the gradient coil with respect to conductive structures of the NMR device.

12. Gradient coil system according to claim 6, characterized in that a shielding coil is allocated to the gradient coil shielding the magnetic field generated by the gradient coil with respect to conductive structures of the NMR device.

13. Gradient coil system according to claim 7, characterized in that the shielding coil comprises no crossings.

14. Gradient coil system according to claim 8, characterized in that the shielding coil comprises no crossings.

15. Gradient coil system according to claim 9, characterized in that the shielding coil comprises no crossings.

16. Gradient coil system according to claim 10, characterized in that the shielding coil comprises no crossings.

17. Gradient coil system according to claim 11, characterized in that the shielding coil comprises no crossings.

18. Gradient coil system according to claim 12, characterized in that the shielding coil comprises no crossings.

* * * * *